United States Patent
Pyeon et al.

(10) Patent No.: US 9,476,938 B2
(45) Date of Patent: Oct. 25, 2016

(54) METHOD AND APPARATUS FOR TESTING SURFACE MOUNTED DEVICES

(71) Applicant: NovaChips Canada Inc., Ottawa (CA)

(72) Inventors: Hong Beom Pyeon, Ottawa (CA); Young-Goan Kim, Seongnam-si (KR)

(73) Assignee: Novachips Canada Inc., Ottawa (CA)

( * ) Notice: Subject to any disclaimer, the term of this patent is extended or adjusted under 35 U.S.C. 154(b) by 88 days.

(21) Appl. No.: 14/478,824

(22) Filed: Sep. 5, 2014

(65) Prior Publication Data

US 2015/0095733 A1 Apr. 2, 2015

Related U.S. Application Data

(60) Provisional application No. 61/883,364, filed on Sep. 27, 2013.

(51) Int. Cl.
| | | |
|---|---|---|
| G11C 29/00 | (2006.01) | |
| G01R 31/317 | (2006.01) | |
| G01R 31/3181 | (2006.01) | |
| G11C 29/12 | (2006.01) | |
| G11C 29/56 | (2006.01) | |
| G11C 16/00 | (2006.01) | |
| G11C 29/26 | (2006.01) | |

(52) U.S. Cl.
CPC ... *G01R 31/31713* (2013.01); *G01R 31/31701* (2013.01); *G01R 31/31813* (2013.01); *G11C 29/1201* (2013.01); *G11C 29/56* (2013.01); *G11C 16/00* (2013.01); *G11C 2029/2602* (2013.01); *G11C 2029/5602* (2013.01)

(58) Field of Classification Search
CPC .............. G01R 31/31713; G01R 31/31701; G01R 31/31813; G11C 29/56; G11C 29/1201; G11C 2029/5602; G11C 2029/2602; G11C 16/00

See application file for complete search history.

(56) References Cited

U.S. PATENT DOCUMENTS

| | | | | |
|---|---|---|---|---|
| 6,067,262 | A * | 5/2000 | Irrinki ................... | G11C 29/006 365/200 |
| 7,496,819 | B2 | 2/2009 | Kumar et al. | |
| 7,508,724 | B2 | 3/2009 | Pyeon | |
| 8,392,767 | B2 | 3/2013 | Pyeon | |
| 8,812,768 | B2 | 8/2014 | Przybylski et al. | |
| 2005/0021884 | A1* | 1/2005 | Jeddeloh ............. | G06F 13/4009 710/22 |
| 2005/0060600 | A1* | 3/2005 | Jeddeloh ............. | G06F 11/2221 714/5.11 |
| 2008/0201548 | A1* | 8/2008 | Przybylski .......... | G06F 13/4243 711/171 |
| 2009/0185434 | A1* | 7/2009 | Pyeon ....................... | G11C 5/04 365/189.11 |
| 2009/0265589 | A2* | 10/2009 | Pyeon .................. | G11C 29/025 714/715 |
| 2010/0135092 | A1* | 6/2010 | Pyeon .................. | G11C 29/003 365/200 |

* cited by examiner

*Primary Examiner* — Bryce Bonzo
*Assistant Examiner* — Thien D Nguyen
(74) *Attorney, Agent, or Firm* — Shin Hung (57) ABSTRACT

An apparatus comprising a plurality of devices connected in series with one another, each of the devices comprising a test enable pin for receiving a test enable signal that indicates enablement of a test mode, and a test output pin for outputting a test output signal in the test mode, and a controller coupled to the devices and comprising an additional test output pin for outputting a test channel output signal, wherein a failure of at least one of the test output signals and the test channel output signal indicates the existence of one or more potential defects associated with the plurality of devices and the controller.

18 Claims, 8 Drawing Sheets

METHOD AND APPARATUS FOR TESTING SURFACE MOUNTED DEVICES

CROSS-REFERENCE TO RELATED APPLICATIONS

The present application claims benefit of U.S. Provisional Patent Application No. 61/883,364 filed Sep. 27, 2013 by Hong Beom PYEON et al. and entitled "Method and Apparatus for Testing Surface Mounted Devices."

STATEMENT REGARDING FEDERALLY SPONSORED RESEARCH OR DEVELOPMENT

Not applicable.

REFERENCE TO A MICROFICHE APPENDIX

Not applicable.

BACKGROUND

Surface mounted devices (SMD) are commonly used in a wide variety of electronic applications including computers, memory devices, solid state drives (SSDs), cellular phones, televisions, etc. In a typical SMD setup, a plurality of packaged chips or dies may be mounted to a printed circuit board (PCB). One method of mounting involves a plurality of solder balls on a surface of a package used to contain the chip or die. One or more defects may occur in such a device. Accordingly, surface mounted testing (SMT) may be performed to access such devices. Defects present problems in SMD systems such as SSDs due to the high cost of final SSD products. For instance, a single defect may render a whole SSD product unusable. Therefore, a testing procedure that locates defects on the surface of a PCB before product release may be desired.

SUMMARY

In an embodiment, the disclosure includes an apparatus comprising a plurality of devices connected in series with one another, each of the devices comprising a test enable pin for receiving a test enable signal that indicates enablement of a test mode, and a test output pin for outputting a test output signal in the test mode. The apparatus further comprises a controller coupled to the devices. The controller comprises an additional test output pin for generating a test channel output signal, wherein a failure of at least one of the test output signals and the test channel output signal indicates the existence of one or more potential defects associated with the plurality of devices and the controller.

In another embodiment, the disclosure includes a method for performing surface mount testing on a plurality of serially-connected memory devices that are coupled to a memory controller, the method comprising feeding a test enable signal to each memory device to enable a test mode, generating a plurality of test output signals in the test mode, each test output signal being generated from one memory device, and generating a test channel output signal in the memory controller, wherein a failure of the plurality of test output signals and the test channel output signal indicates the existence of one or more potential defects associated with the memory devices and the memory controller.

In yet another embodiment, the disclosure includes a memory system comprising a printed circuit board (PCB) with electrical traces forming connections among a plurality of serially-connected memory devices, the plurality of memory devices mounted on a surface of the PCB. Each memory device is configured to compare an incoming pattern to an internal pattern, and generate a test output signal based on the comparison between the incoming pattern and the internal pattern, wherein a failure of the test output signal determines a defect location associated with the memory device.

These and other features will be more clearly understood from the following detailed description taken in conjunction with the accompanying drawings and claims.

BRIEF DESCRIPTION OF THE DRAWINGS

For a more complete understanding of this disclosure, reference is made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein are surface mounted testing (SMT) embodiments to enable not only detecting one or more potential defects within a system, but also pinpointing locations of the potential defects. In a memory system comprising a plurality of series-connected memory devices and a memory controller that together form a ring topology, a disclosed SMT method may detect exact SMT defects in series-connected memory devices. In an embodiment, the memory controller may generate and output a test data pattern, which feeds into a first memory device. The first memory device may compare this test pattern with an internal pattern and generate a test output signal based on the comparison. If a mismatch occurs between the two patterns, the test output signal fails, indicating the existence of a potential defect between the memory controller and the first device. Further, the first memory device may generate another test pattern and propagate it to a next memory device, where similar testing is performed. This way, the connections for all memory devices and the memory controller may be tested. The memory controller generates a test channel output signal, which may be a logic AND combination of multiple channels of memory device test results. For example, if any test in a particular channel fails, the test channel output signal fails. Thus, determining whether defects exist in the memory system can be achieved by monitoring the test output signals, which can be visualized as on/off status of light emitting diodes (LEDs), thereby simplifying the overall testing implementation. In some embodiments, the location of a defect may be pinpointed by determining which test output signal has failed. Moreover, electrical testing may include finding open connections and short connections on the surface of the PCB and fixing defects. As discussed below, an at-speed test may expose slightly contacted balls during SMT.

Figure 1:
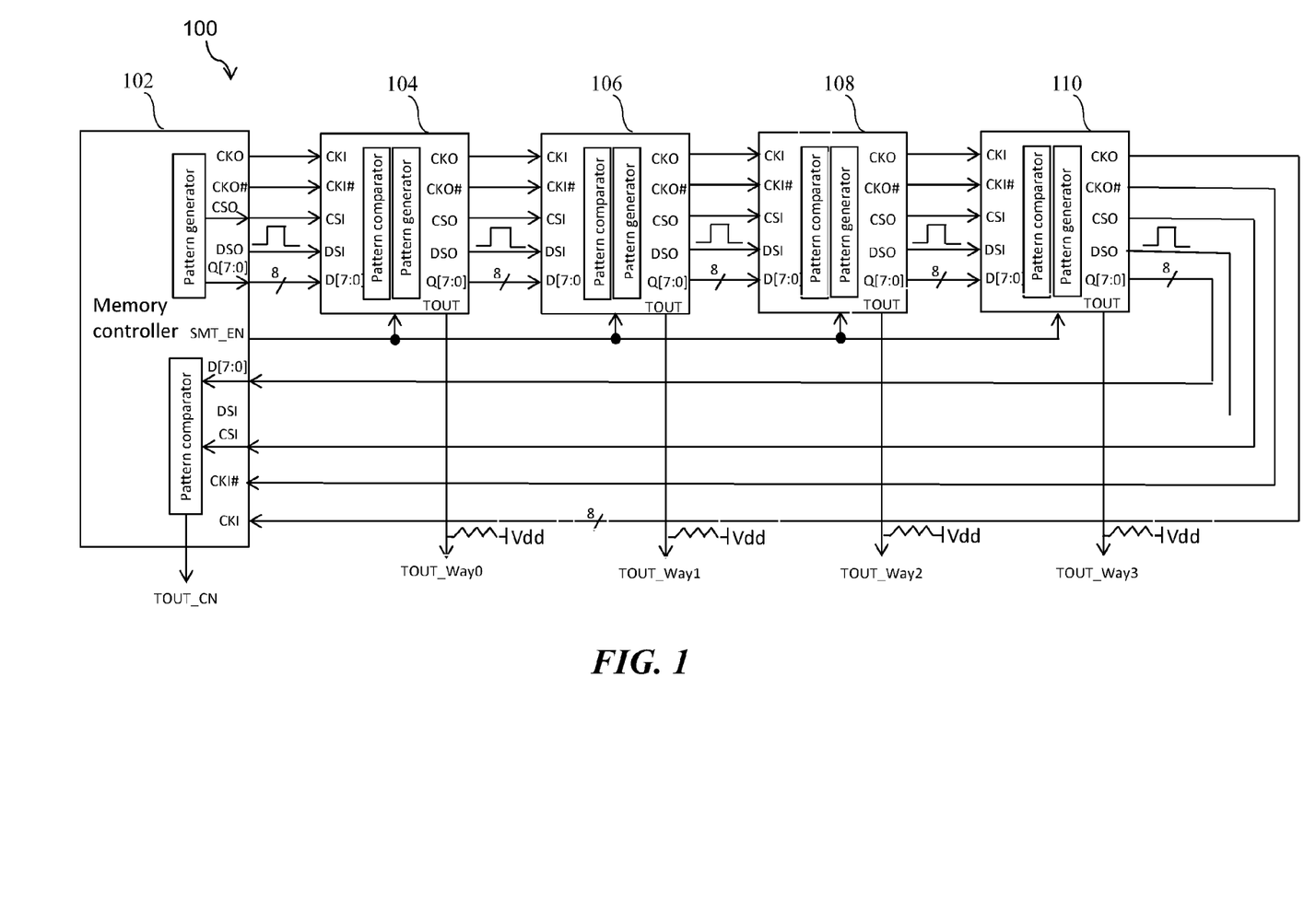
FIG. 1 is a schematic diagram showing an embodiment of a memory system.

FIG. 1 illustrates a memory system 100 according to an embodiment of the present disclosure. The memory system 100 includes a memory controller 102 and multiple memory devices 104, 106, 108 and 110 that are connected in series. The memory controller 102 may include or be embodied within a computer system, which may comprise at least one processing device such as a microcontroller, microprocessor, and/or digital signal processor having a central processing unit (CPU). As shown in FIG. 1, the memory controller 102 may have one or more output ports (e.g., CSO and Q[7:0]) and one or more input ports (e.g., CSI and D[7:0]). Further, each memory device may have one or more input ports (CSI and D[7:0]) and output ports (CSO and Q[7:0]). Input and output ports may comprise physical pins or connections interfacing a memory device to the memory system 100.

In one embodiment, the memory devices 104, 106, 108 and 110 can be flash memory devices (e.g., HyperLink NAND (HLNAND)) located in an SSD. Alternately, the memory devices can be DRAM, SRAM, or any other type of volatile or non-volatile memory device having a compatible input/output interface and otherwise capable of executing commands. In the memory system 100, memory devices 104, 106, 108 and 110 may be (but are not necessarily) substantially identical to each other. Those skilled in the art should understand that flash memory may be organized into banks, and that each bank may be organized into blocks to facilitate block erasure. Some commercially available NAND flash memory devices have two banks of memory. The memory system 100 may further comprise a PCB with electrical traces forming connections among the memory devices 104-110 and the memory controller 102, and SMT may be performed to verify functionalities of these connections. Further, although FIG. 1 shows a memory system according to an aspect of the disclosure, one of ordinary skill in the art would recognize that the principles disclosed herein can be applied to other systems with similar and/or different topologies.

For example, the memory system 100 shown in FIG. 1 includes four memory devices 104, 106, 108 and 110, but alternate embodiments can include a single memory device, or any other suitable number of memory devices. For convenience, the following discussion will refer to memory device 104 as the first device of the memory system 100 (as its inputs connect to outputs of the memory controller 102) and memory device 110 as the N-th or last device (as its outputs connect to the inputs of the memory controller 102), where N is a positive integer. Memory devices 106 and 108 are then intervening devices serially connected between the first and last memory devices 104 and 110, respectively.

Each memory device 104, 106, 108 and 110 can assume a distinct identification (ID) number, or device address (DA) upon power up initialization of the system, so that they are individually addressable.

Memory devices 104-110 are considered serially connected because the data inputs of one memory device are connected to the data outputs of a preceding or previous memory device, thereby forming a series-connection system organization, with the exception of the first memory device 104 and the last memory device 110 in the chain (sometimes referred to as a Daisy Chain). The memory devices 104-110 form a ring topology with the memory controller 102. Herein, a "current device" in the ring topology may be referred to as a device residing between a preceding device and a succeeding device. Further, the memory controller 102 may be considered the preceding device of the first device 104 as well as the succeeding device of the last device 110.

Each memory device 104-110 is designed to receive commands and data in one or more serial bitstreams from a preceding memory device. Accordingly, such memory devices can be referred to as serial memory devices since their input and output interface circuits receive and transmit data serially. Each memory device may be positioned on a PCB such that the distance and signal track length between output port pins on one device and the input port pins of the next device in the ring is minimized. Alternately, the four memory devices 104, 106, 108 and 110 can be collected in a system in package module (SIP), which further minimizes signal track lengths. Memory controller 102 and memory devices 104 to 110 are serially connected to form a ring topology, meaning that the last memory device 110 provides its outputs back to the memory controller 102. As such, those skilled in the art will understand that the distance between memory device 110 and memory controller 102 is easily minimized.

Each memory device 104-110 may operate in a test mode (or SMT mode) and a normal or operational mode. In an embodiment, each memory device may have a dedicated test enable (SMT_EN) pin for receiving a test enable signal that indicates enablement of the test mode and a test output (TOUT) pin for outputting a test output signal in the test mode. The memory controller 102 provides control signals in parallel to the memory devices 104-110. These include a test enable signal, denoted as SMT_EN. In one embodiment, the memory devices 104-110 may enter a test mode when SMT_EN is at a high logic level, and exit the test mode when the SMT_EN is at a low logic level (or vice versa). Since the serial memory devices are connected in a ring, a defect in any of the memory devices 104, 106, 108, or 110 breaks communication within the ring, in which case the memory controller 102 may be unable to communicate with one or more of the memory devices 104, 106, 108, and 110 in the memory system 100. As a result, SMT_EN may be setup as a common signal to all serial memory devices 104, 106, 108, and 110, and used to put the entire memory into the test mode.

Operation of the memory system 100 can be asynchronous or synchronous. FIG. 1 illustrates an example of a synchronous system that uses a common clock signal, which is provided in sequence to each memory device 104-110. The memory controller 102 may include clock output ports CKO# and CKO for providing complementary clock signals CK and CK# to the first device 104, and clock input ports CKI# and CKI for receiving the complementary clock signals from the last device 110. In this case, the "#" symbol in CKI# and CKO# indicates that the signal is an inverted signal of CKI and CKO, respectively. In an embodiment, the CK/CK# system clock may be used to identify connections with slight contact that would be missed if a slower test clock were used.

Each of the memory devices 104-110 may also be configured to receive a system clock signal (CK and CK#) at test clock pins. The system clock signal may control timing of the generation of a test pattern and timing of the comparison between an incoming pattern and an internally generated pattern. Each memory device may include a clock synthesizer, such as a delay-locked loop (DLL) or a phase-locked loop (PLL) for generating phases of the received clocks. Certain phases are used to internally centralize the clock edges within a valid window of the input data to ensure reliable operation. In an embodiment, each memory device has clock output ports CKO# and CKO for passing the complementary clock signals to the clock input ports of the next memory device, and clock input ports CKI and CKI# for receiving the complementary clock signals from a preceding device (either the memory controller 102 or a previous memory device). The last memory device 110 provides the clock signals back to the memory controller 102.

The channel of memory controller 102 includes data, address, and control information provided by separate pins, or the same pins, connected to conductive lines. The embodiment of FIG. 1 includes one channel with output ports and corresponding input ports. However, the memory controller 102 can include any suitable number of channels for accommodating separate memory device chains. As shown in FIG. 1, the channel of memory controller 102 includes a command strobe output (CSO) (echo of CSI), data output ports Q[7:0], command strobe input (CSI), data input ports D[7:0], a data strobe input (DSI), and a data strobe output (DSO) (echo of DSI). Output ports Q[7:0] and input ports D[7:0] are shown as having eight bits in width, but they can be n bits in width, where n is a positive integer, depending on the characteristics of the memory controller 102. DSI is used for enabling the output ports Q[7:0] buffer of a selected memory device to output read data, and may have a pulse duration for delimiting read data provided from Q[7:0] so that the memory controller 102 knows when to latch data on its return from the last memory device 110.

The memory system 100 may employ high speed operation and a high speed signaling format such as a high-speed transceiver logic (HSTL) signaling format. Accordingly, a reference voltage (VREF) may be provided to and used by each memory device 104-110 to determine the logic level of signals received at various input ports. The reference voltage may be generated by another circuit on the printed circuit board, for example, and may be set to a predetermined voltage level based on the voltage swing mid-point of the HSTL signal.

Each of the memory devices 104-110 may comprise a pattern generator, a pattern comparator, and two dedicated pins for SMT. One dedicated pin denoted as SMT_EN may indicate enablement of the SMT mode, while another dedicated test output pin denoted as TOUT may output a signal to indicate whether there is a failure associated with the memory device. For instance, memory device 106 may generate a test output signal TOUT_Way1 indicating a defect in the connections between the devices 104 and 106. The pattern generator and pattern comparator of each device 104-110 are further described below.

The memory controller 102 may be configured to generate a test channel output signal (TOUT_CN), which may be output from a test output pin in the memory controller 102. The TOUT_CN signal is generated based on pattern comparison between a test pattern sent by the memory device 110 and an expected test pattern stored inside the memory controller 102. Similar to the TOUT_way signals, the TOUT_CN signal may determine whether there is any SMT failure or electrical defect in the traces between the memory device 110 and the memory controller 102.

Figure 2:
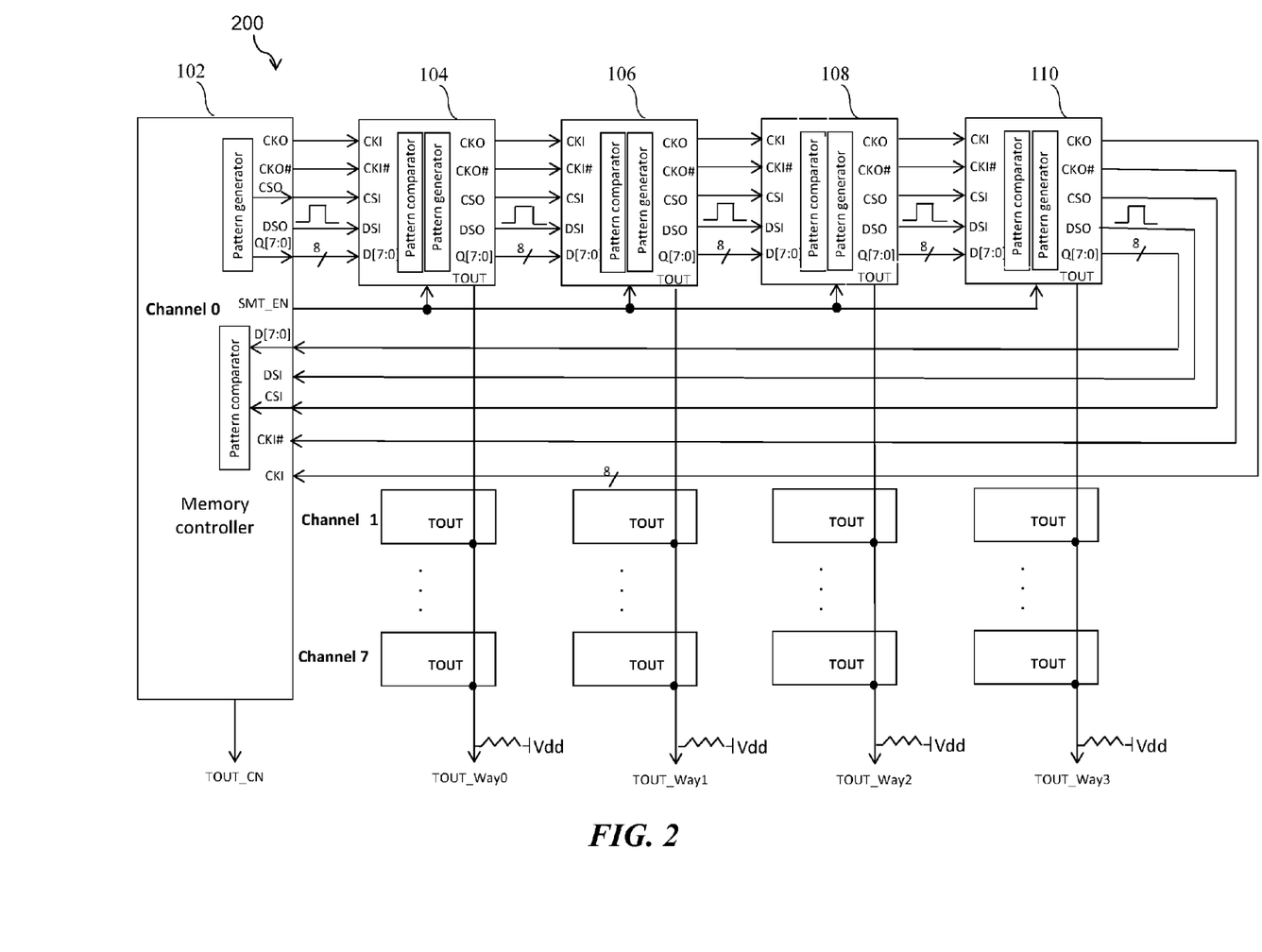
FIG. 2 is a schematic diagram showing another embodiment of a memory system, which is similar to the memory system shown in FIG. 1 but with multiple channels.

FIG. 2 illustrates an embodiment of a memory system 200, which is similar to the memory system 100 but has multiple channels (denoted as Channels 0-7) connected to the memory controller 102. The TOUT pins may be wired-OR connections. A TOUT_way driver may comprise a pull down driver (e.g., N-type metal-oxide-semiconductor (NMOS)) like resistor-low voltage (R/B#) configuration. For instance, as shown in FIG. 2, each TOUT signal may be connected to a voltage, denoted as Vdd, via a resistor. In an embodiment, SMT outputs from multiple (e.g., eight) channels may be combined with a logical AND operation, which is expressed as a TOUT_CN signal. In this case, when at least one of multiple channel results has a logic "low," an internally generated the TOUT_CN signal from the memory controller 102 can be configured with a logical AND operation to see whether or not one of multiple-channel results has failed. In an embodiment, a failure (e.g., logic low) of TOUT_CN indicates the existence of one or more potential defects associated with the memory device 110 and the memory controller 102.

Figure 3:
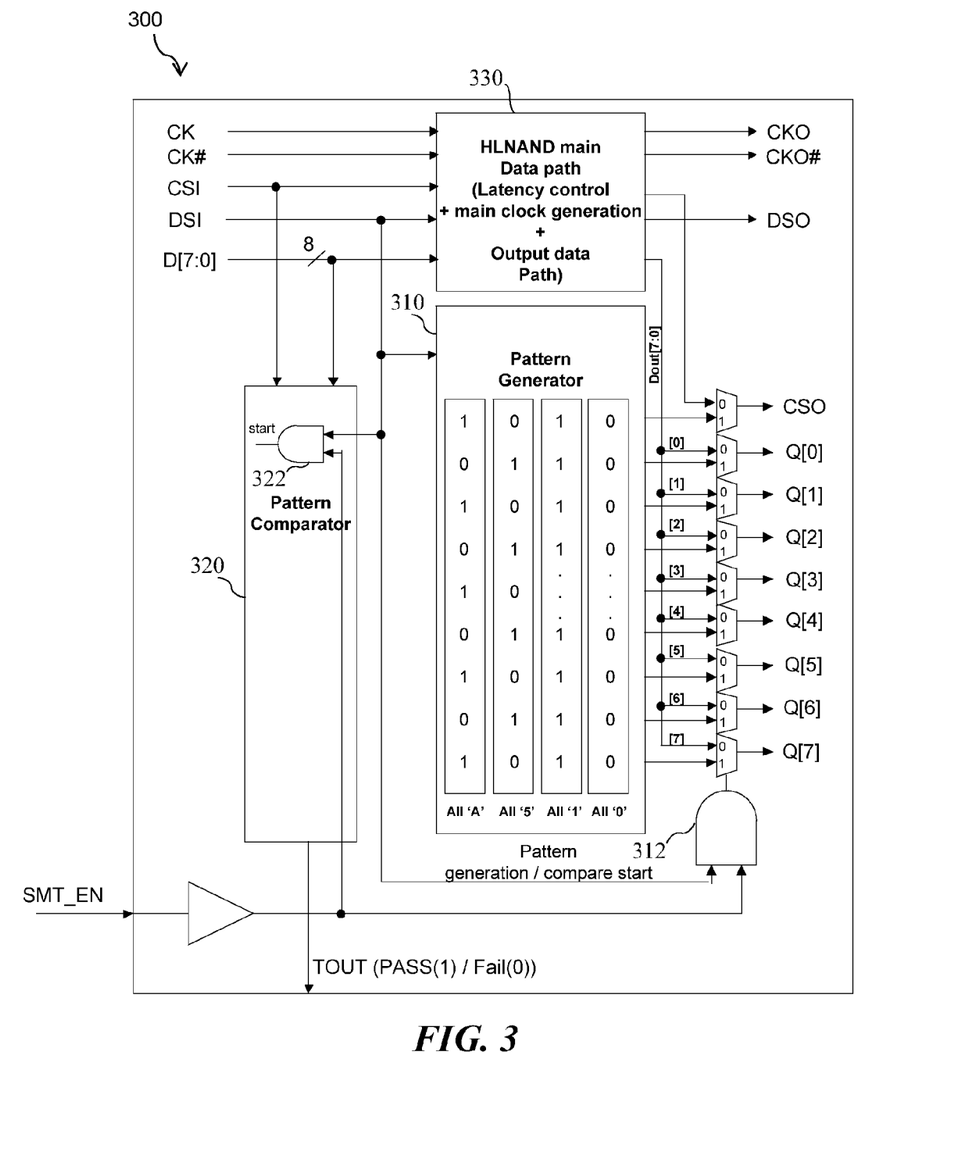
FIG. 3 is a schematic diagram showing an embodiment of a memory device.

FIG. 3 illustrates an embodiment of a memory device 300 comprising a pattern generator 310, a pattern comparator 320, a main data path module 330, and input/output pins arranged as shown. The memory device 300 may be implemented as any and/or each of the memory devices 104-110. Some components of the memory device 300, including the pattern generator 310 and the pattern comparator 320, may also be implemented inside the memory controller 102. The pattern generator 310 and the pattern comparator 320 may be used in a test or SMT mode, while the main data path module 330 may be used in a normal operation mode.

In the test mode while SMT_EN is high, a DSI signal feeds into the pattern generator 310, which generates an internal data pattern. The internal data pattern may be any pre-set pattern, such as '000'h, '1FF'h, '0AA'h, and '155'h as shown in FIG. 3. As discussed above, the SMT_EN signal may be set as high in the test mode, causing an AND gate 312 to produce a logic high (i.e., 1). Accordingly, output pins CSO and Q[7:0] select data from the pattern generator 310 to output from the memory device 300. The internally-generated data pattern may feed into a succeeding device (e.g., from memory device 104 to memory device 106, or from memory device 110 to memory controller 102). Otherwise, if the AND gate 312 produces a logic low (0) such as when SMT_EN is set to low in the normal operation mode, output pins CSO and Q[7:0] would select data from the main data path module 330 to output from the memory device 300.

Additionally, in the test mode, a test pattern from a preceding device may be fed into the memory device 300 (e.g., via input pins CSI and D[7:0]). The pattern comparator 320 may then compare the test with an internal pattern. The internal pattern may carry hard-wired expected data inside the pattern comparator 320, or may be the direct output of the pattern generator 310. As shown in FIG. 3, the internal pattern is implemented as a hard-wired pattern of '000'h, '1FF'h, '0AA'h, and '155'h. The pattern comparator 320 may comprise an AND gate 322 for receiving three inputs: SMT_EN, DSI, and CK. When these inputs are enabled, the AND gate 322 generates a high signal to start comparing the incoming test pattern with the hard-wired data using data or delay flip-flop (DFF) blocks. If the incoming pattern matches with the expected pattern, the pattern comparator 320 generates a "pass" output signal TOUT to indicate that there is no connection defect between a preceding device and the memory device 300; otherwise, if the incoming pattern mismatches with the expected pattern, the pattern comparator 320 generates a "fail" output signal TOUT to indicate that there may be one or more defects associated with the memory device 300. Specifically, the defect(s) may be located in output pins of the preceding device, in connections between the preceding device and the memory device 300, inside input pins of the memory device 300, and/or inside the pattern comparator 320.

Putting the memory device 300 into perspective of a memory system (e.g., the memory system 100), the memory device 300 may be considered a current device (e.g., device 106) placed between a preceding device (e.g., device 104) and a succeeding device (e.g., device 108). The current device 300 is configured to receive an incoming pattern from the preceding device at data input pins (D[7:0]), compare the incoming pattern to an internal pattern using a pattern comparator, and cause the test output signal TOUT to fail upon detecting a mismatch between the incoming pattern and the internal pattern. The failure of the test output signal pinpoints a potential defect location to be in the preceding device, the current device, or connections therebetween. Further, the current device may generate the same internal pattern using a pattern generator and pass the generated pattern to the succeeding device. Accordingly, the succeeding device may test defects in the same way as the current device.

Figure 4:
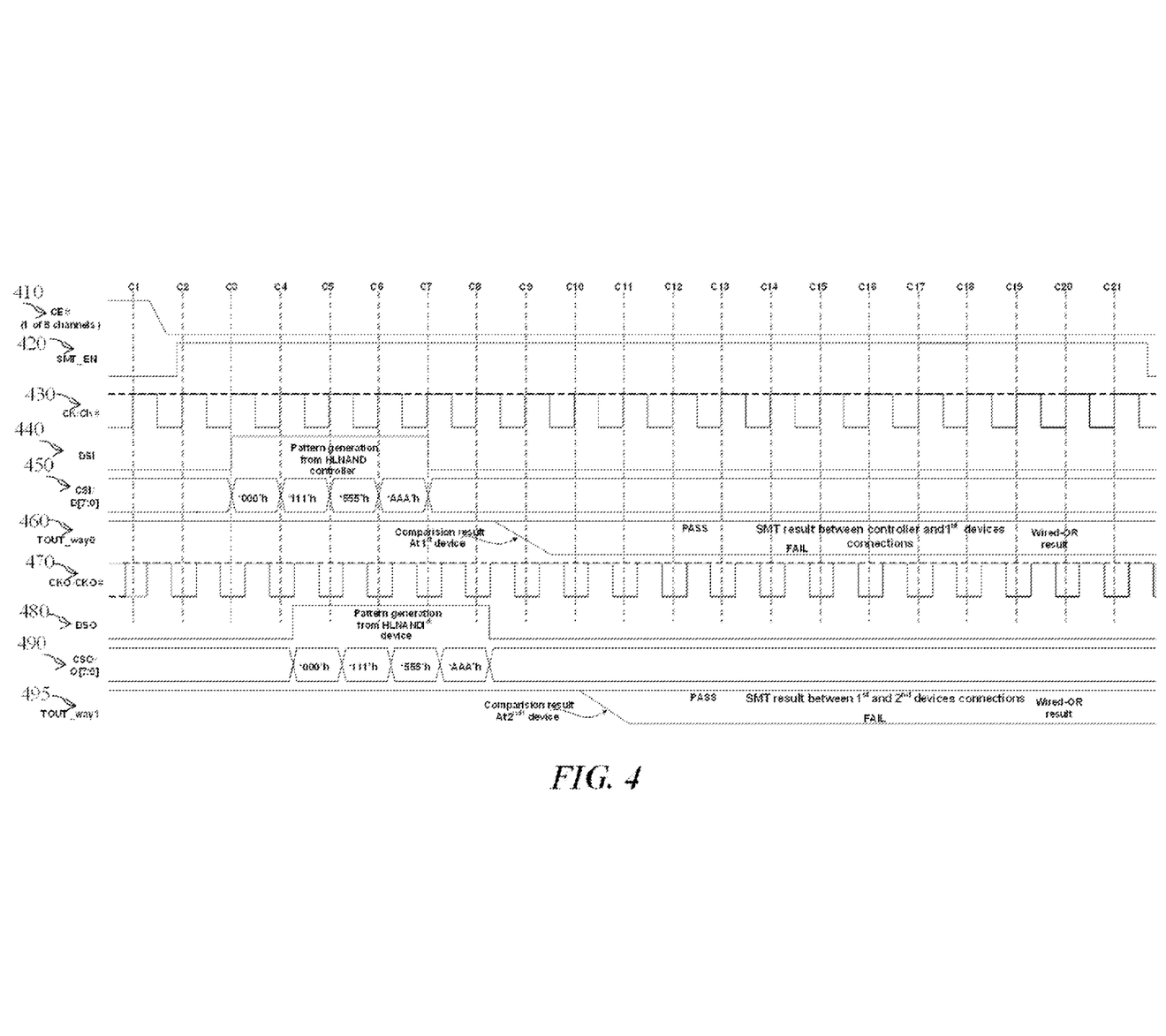
FIG. 4 illustrates an exemplary timing diagram during the operation of a memory system in a test mode.

FIG. 4 illustrates an examplary timing diagram during the operation of a memory system (e.g., the memory system 100) in a test mode to demonstrate principles disclosed herein. Time periods, separated by markers C1-C21, may each last one clock cycle (or any other suitable time length), and the duration of a clock cycle is flexible depending on system design. The clock cycles are determined by clock signal 430 shown as CK/CK#.

The memory system may comprise a plurality of channels (e.g., 8 channels), each of which may function in a similar manner. Thus, one of the channels is discussed as an example. A chip enable signal 410 (denoted as CE#) may be used by a memory controller (e.g., controller 102) to control operation status. In one example using the chip enable signal 410, the devices are enabled when CE# is at the low logic level. Since the serial memory devices are connected in a ring, disabling any of the devices breaks communication around the ring and the memory controller becomes unable to communicate with all of the memory devices in the memory system. As a result, CE# may be a common signal to all serial memory devices, and used to put the entire memory system into a low power state.

As discussed above, the devices may enter or stay in the test mode when SMT_EN is at the high logic level. Thus, when a SMT_EN signal 420 changes from low to high in the period between C1 and C2 in FIG. 4, the memory system enters the test mode. The memory controller then feeds a clock signal 430 into a first device. As discussed above with respect to FIG. 3, a DSI signal 440 serves as a test enable input of both the pattern generator and pattern comparator, and enables data generation and comparison when at a logic high. Thus, when DSI transitions from low to high at point C3, the memory controller may generate a pre-determined data pattern, e.g., '000'h, '1FF'h, '0AA'h, and '155'h over four clock cycles. This data pattern (shown as a signal 450 in FIG. 4) is sent by the memory controller to the first memory device via CSI and input pins D[7:0]. Suppose the first device has hard-wired data pattern '000'h, '1FF'h, '0AA'h, and '155'h, then a pattern comparator in the first device may compare the incoming pattern with the hard-wired pattern around between periods C8-C10. If the two patterns match, the first device may generate a TOUT_way0 signal 460 as a high logic to indicate a test pass; otherwise, TOUT_way0 signal 460 would be a low logic to indicate a test failure.

The system clock signal 470 output from the first device may further feed into a second device. Note there may be a delay between clock signals 430 and 470 due to serial feeding of clock signal from one device to the next. The first device also outputs a DSO signal 480, which is received as a DSI signal at the second device. In addition, the first device generates a data pattern 490, '000'h, '1FF'h, '0AA'h, and '155'h over four clock cycles, and sends the data pattern 490 to the second device via CSO and Q[7:0] pins. Similar to the first device, in the periods between C10 and C12, the second device then compares this incoming data pattern with another hard-wired pattern stored in its pattern comparator. If the two patterns match, the second device generates a TOUT_way1 signal 495 as a high logic to indicate a test pass; otherwise, TOUT_way1 signal 495 would be a low logic to indicate a test failure. As discussed above, each of the test results may be a wired OR result.

Although most aspects discussed herein focus on the operation of the test mode, it should be understood that the disclosed components and embodiments may also be used in normal operation and other modes. For instance, when SMT_EN signal is at a low logic during a normal operation mode, a TOUT signal may be used for other purposes such as, but not limited to, cyclic redundancy check (CRC) result monitoring.

Figure 5:
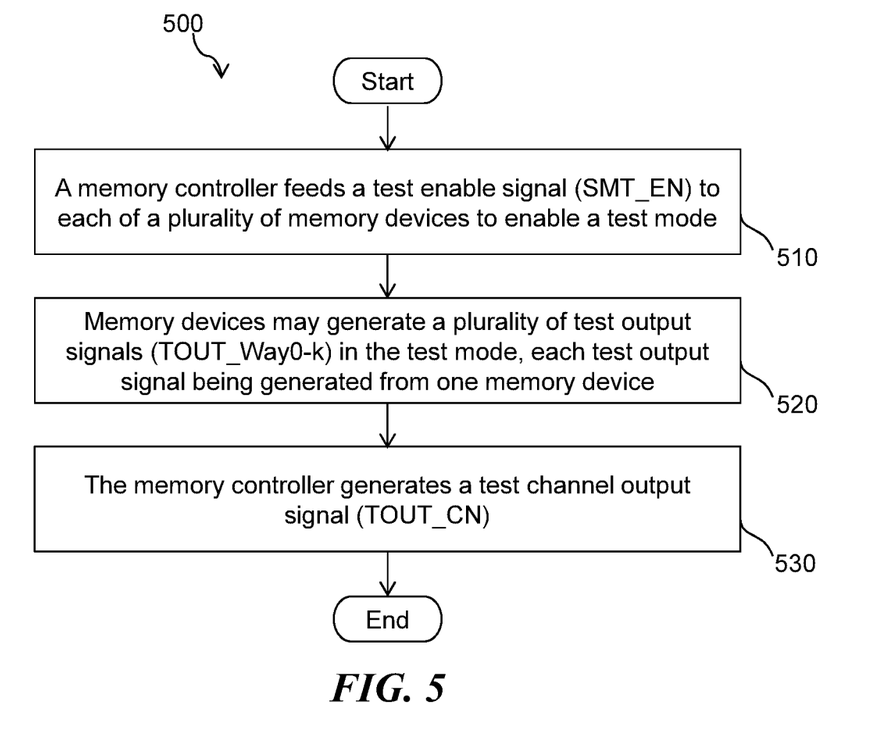
FIG. 5 is a flowchart showing an embodiment of a method for performing SMT on a plurality of serially-connected memory devices that are coupled to a memory controller.

FIG. 5 illustrates an embodiment of a method 500 for performing SMT on a plurality of serially-connected memory devices (e.g., devices 104, 106, 108 and/or 110) that are coupled to a memory controller (e.g., controller 102). The method 500 may be implemented by a memory system disclosed herein (e.g., the memory system 100). The method 500 starts in step 510, where the memory controller may feed a test enable signal (SMT_EN) to each of the plurality of memory devices to enable a test mode. In step 520, the memory devices may generate a plurality of test output signals (TOUT_Way0-k) in the test mode, each test output signal being generated from one memory device based on a comparison of an incoming test pattern to an internal pattern.

In step 530, the memory controller may generate a test channel output signal (TOUT_CN) based on a comparison between a test pattern received from a last memory device and an internal pattern stored in the memory controller. In an embodiment, the memory controller may be coupled to a plurality of channels, at least one of which is formed by connections between the memory controller and the memory devices. In this case, the test channel output may be implemented as a logic AND operation of the channels such that if test results in any one of the channels fails, the test channel output signal would fail. The failure of the test channel output signal indicates the existence of one or more potential defects associated with the last memory device and the memory controller.

Suppose the memory devices include a current device connected between a preceding device and a succeeding device. In an embodiment, the method 500 further comprises comparing, by the current device, an incoming pattern from the preceding device to an internal pattern in the current device. Any suitable pattern may be used. For instance, the test pattern and the internal pattern may both be '000'h, '1FF'h, '0AA'h, and '155'h. From the perspective of the current device, the test output signal fails upon detecting a mismatch between the incoming pattern and the internal pattern in the current device, and the failure of the test output signal (TOUT that is generated and output by the current device) pinpoints a potential defect location to be in the preceding device, the current device, or connections therebetween. For instance, the traces between the preceding device and the current device may be defective, rendering a test pattern from the preceding device unable to reach the current device. According to the method 500, the current device may further generate a test pattern and output the test pattern at data output pins (Q[7:0]) to the succeeding device, wherein the test pattern is used in the test mode as the incoming pattern of the succeeding device.

Figure 6:
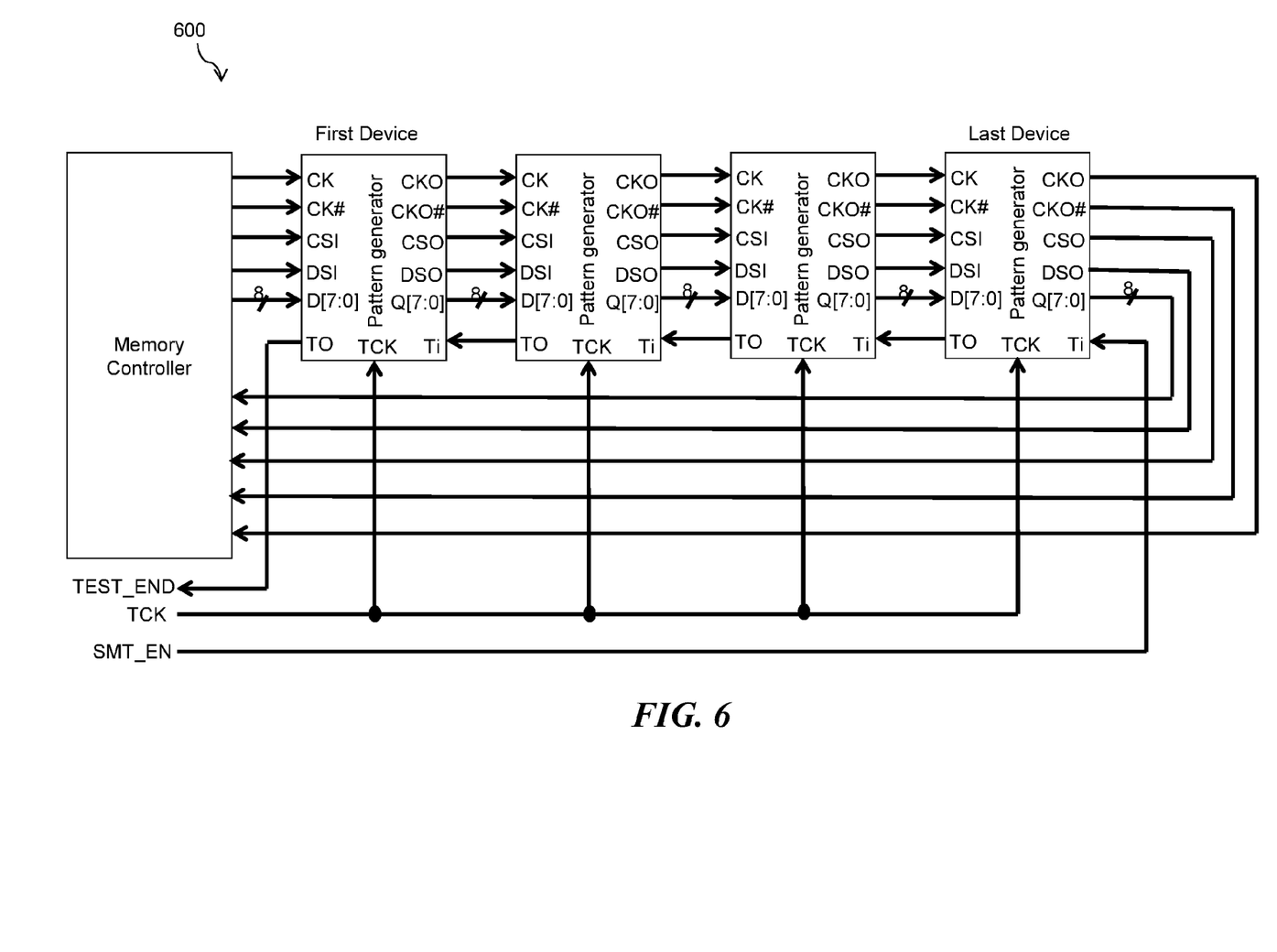
FIG. 6 illustrates another embodiment of a memory system.
Figure 7:
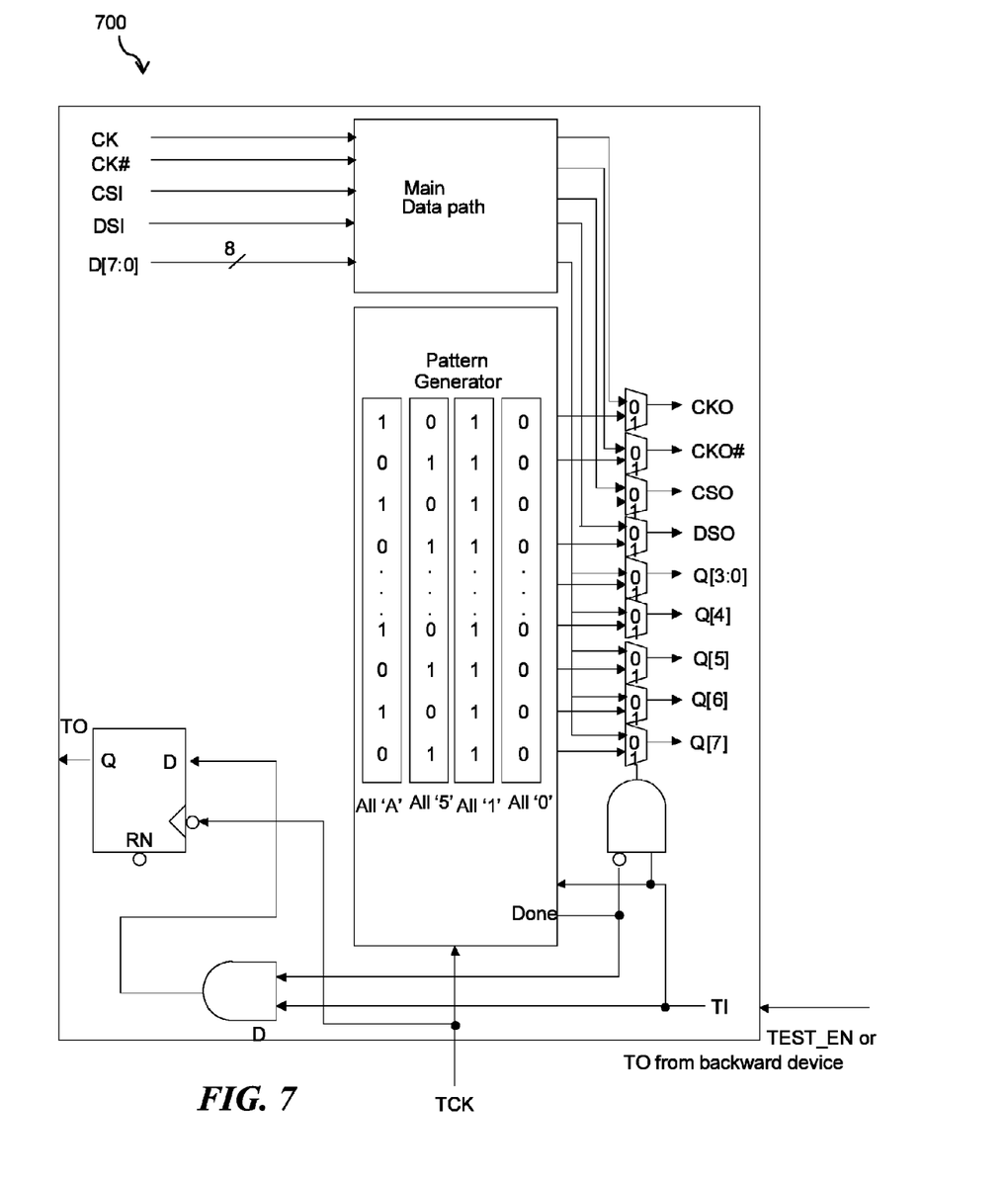
FIG. 7 illustrates another embodiment of a memory device.
Figure 8:
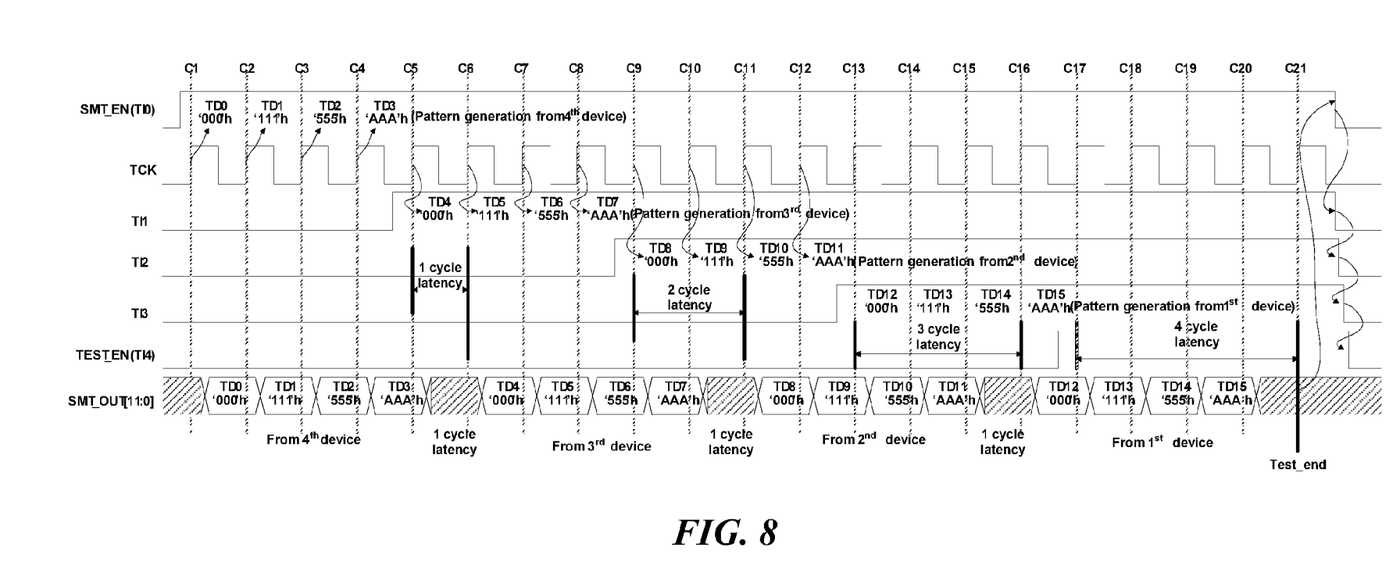
FIG. 8 illustrates another exemplary timing diagram for operation in a test mode using the memory system shown in FIG. 6.

FIG. 6 illustrates another embodiment of a memory system 600 comprising a memory controller and multiple memory devices. Many aspects of the memory system 600 are the same as or similar to the memory systems described above. Each memory device comprises three dedicated pins, denoted as Ti, TO, and TCK, for the SMT mode. FIG. 7 illustrates another embodiment of a memory device 700, which may be used as any of the memory devices in the memory system 600. FIG. 8 illustrates an exemplary timing diagram for operation in a test mode using the memory system 600. One of ordinary skill in the art would understand features disclosed by FIGS. 6-8 in light of the embodiments disclosed herein and U.S. Provisional Patent Application No. 61/883,364. For instance, FIGS. 4-9 of U.S. Provisional Patent Application No. 61/883,364 and relevant descriptions, which are incorporated herein by reference, contain various fail cases. In each of these fail cases, electrical defects occur at different locations (e.g., in connections between different devices), so data patterns are tested to determine its location. Thus, some of these features are not further elaborated in the interest of conciseness.

Having described the systems and methods disclosed herein, various embodiments according to the present disclosure may include, but are not limited to those provided below.

In an embodiment, a method is provided for performing surface mount testing (SMT) on a plurality of serially-connected memory devices that include a first device and a last device. The method comprises outputting a test output signal (SMT_OUT) from the last device, the test output signal comprising a sequence of data patterns, each corresponding to a respective one of the plurality of memory devices, the data patterns being output sequentially starting with that of the last device and ending with that of the first device, each data pattern being separated from a neighboring data pattern by a latency period; identifying one latency period as a fail period, before which no data pattern mismatches with a test pattern, and after which no data pattern matches with the test pattern; and determining at least one potential defect associated with one or two memory devices, the one or two memory devices corresponding to one or two data patterns neighboring the fail period.

In some implementations of the method, the sequence of data patterns comprises a first data pattern generated by the last device, wherein the first data pattern trails the fail period and mismatches with the test pattern, and wherein the last device and its output connections are determined to be potentially defective based on the first data pattern.

Additionally or alternatively, the sequence of data patterns comprises a last data pattern generated by the first device, wherein the last data pattern precedes the fail period and matches with the test pattern, and wherein the first device and connections between a memory controller and input pins of the first device are determined to be potentially defective based on the last data pattern.

Additionally or alternatively, the sequence of data patterns comprises two data patterns, wherein one of the two data patterns immediately precedes the fail period and matches with the test pattern, wherein the other of the two data patterns immediately trails the fail period and mismatches with the test pattern, and wherein two serially-connected memory devices corresponding to the two data patterns and connections between the two serially-connected memory devices are determined to be potentially defective.

Additionally or alternatively, the sequence of data patterns comprises at least one data pattern preceding the fail period and matching with the test pattern, and wherein the method further comprises generating the test pattern using a pattern generator in each of at least one memory device corresponding to the at least one data pattern.

Additionally or alternatively, the plurality of memory devices are mounted on a printed circuit board (PCB) with electrical traces forming connections, and the method further comprises testing the one or two memory devices and the electrical traces associated therewith to detect one or more electrical defects.

Additionally or alternatively, the method further comprises receiving a common test clock signal (TCK) at the plurality of memory devices; receiving a test enable signal (SMT_EN) indicating enablement of the SMT at the last device; and outputting a test end signal (TEST_END) indicating an end of the SMT at the first device, wherein the test output signal is generated based at least in part on the test clock signal and the test enable signal.

Additionally or alternatively, each latency period lasts about one clock cycle of the test clock signal, and each data pattern in the sequence of data patterns lasts an equal number of clock cycles.

Additionally or alternatively, each of the plurality of memory devices comprises a test input pin (TI), a test clock pin (TCK), and a test output pin (TO) that are reserved for the SMT, and wherein the test output pin of each device except the first device is configured to couple to the test input pin of a preceding device.

Additionally or alternatively, the test clock signal and the test enable signal are provided by a memory controller coupled to the plurality of memory devices, wherein the test output signal and the test end signal are received by the memory controller, and wherein the fail period is identified by the memory controller.

In an embodiment, an apparatus is provided comprising a plurality of serially-connected devices including a first device and a last device, each of the devices comprising a test input pin (TI), a test clock pin (TCK), and a test output pin (TO) that are reserved for operation in a test mode, the last device comprising data output pins configured to output a test output signal (SMT_OUT). The apparatus may further comprise a controller configured to determine one or more defect locations associated with at least one of the devices based on the test output signal from the last device.

In some implementations of the apparatus, the test clock input pins of the devices are configured to receive a common test clock signal (TCK), wherein the test input pin of the last device is configured to receive a test enable signal (SMT_EN) indicating enablement of the test mode, wherein the test output pin of each device except the first device is configured to couple to the test input pin of a preceding device, and wherein the test output pin of the first device is configured to output a test end signal (TEST_END) indicating an end of the test mode.

Additionally or alternatively, each of the plurality of serially-connected devices is a NAND flash memory chip located in a solid-state drive (SSD), wherein the controller is a memory controller in the SSD.

Additionally or alternatively, the test output signal comprises a sequence of data patterns, each corresponding to a respective one of the plurality of devices, wherein the data patterns are output sequentially starting with that of the last device and ending with that of the first device, wherein each of the data patterns is separated from a neighboring data pattern by a latency period, wherein the controller is further configured to identify one latency period as a fail period, wherein no data pattern before the fail period mismatches with a test pattern, wherein no data pattern after the fail period matches with the test pattern, wherein the one or more defect locations are determined to be in one or two devices and connections associated therewith, and wherein the one or two devices correspond to one or two data patterns neighboring the fail period.

Additionally or alternatively, the sequence of data patterns comprises a first data pattern generated by the last device, wherein the first data pattern trails the fail period and mismatches with the test pattern, and wherein the one or more defect locations are determined based on the first data pattern to be in the last device and its output connections.

Additionally or alternatively, the sequence of data patterns comprises a last data pattern generated by the first device, wherein the last data pattern precedes the fail period and matches with the test pattern, and wherein the one or more defect locations are determined based on the last data pattern to be in the first device and connections between the controller and input pins of the first device.

Additionally or alternatively, the sequence of data patterns comprises two data patterns, wherein one of the two data patterns immediately precedes the fail period and matches with the test pattern, wherein the other of the two data patterns immediately trails the fail period and mismatches with the test pattern, and wherein the one or more defect locations are determined, based on the two data patterns, to be in two serially-connected memory devices corresponding to the two data patterns and connections between the two serially-connected memory devices.

Additionally or alternatively, at least one of the plurality of devices comprises a pattern generator configured to generate the test pattern, wherein each latency period lasts about one clock cycle of a test clock signal, and wherein each data pattern in the sequence of data patterns lasts an equal number of clock cycles.

In an embodiment, a memory system is provided comprising a printed circuit board (PCB) with electrical traces forming connections among a plurality of serially-connected memory devices and a memory controller, wherein the plurality of memory devices mounted on a surface of the PCB. Each of the memory devices comprises a test input pin (TI), a test clock pin (TCK), and a test output pin (TO) that are reserved for surface mount testing (SMT), the memory devices comprising a first device and a last device, the last device comprising data output pins for outputting a test output signal (SMT_OUT); and the memory controller is mounted on the surface of the PCB and configured to determine a defect location in the memory system based on the test output signal from the last device.

In some implementations of the memory system, the test output signal comprises a sequence of data patterns, each corresponding to a respective one of the plurality of memory devices, wherein the data patterns are output sequentially starting with that of the last device and ending with that of the first device, wherein each of the sequence of data patterns is separated from a neighboring data pattern by a latency period, wherein the memory controller is further configured to identify one latency period as a fail period, wherein no data pattern before the fail period mismatches with a test pattern, wherein no data pattern after the fail period matches with the test pattern, wherein the defect location is determined to be in at least one of the plurality of memory devices and connections associated therewith, and wherein the at least one of the plurality of memory devices corresponds to at least one data pattern neighboring the fail period.

As skilled artisans will readily appreciate, the various illustrative logical blocks, modules, circuits, and method described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. An apparatus comprising:
  a plurality of devices connected in series with one another, each of the devices comprising:
    a test enable pin for receiving a test enable signal that indicates enablement of a test mode; and
    a test output pin for outputting a test output signal in the test mode;
  wherein the plurality of devices include a current device connected between a preceding device and a succeeding device, and the current device is configured to:
    receive an incoming pattern from the preceding device at data input pins;

compare the incoming pattern to an internal pattern in the current device; and provide a failure status in the test output signal generated by the current device upon detecting a mismatch between the incoming pattern and the internal pattern, wherein the failure status in the test output signal indicates a potential defect location to be in connections between the preceding device and the current device; and a controller coupled to the devices and comprising an additional test output pin for outputting a test channel output signal, wherein a failure status in the test channel output signal indicates a potential defect location to be in connections between a device preceding the controller and the controller.

2. The apparatus of claim 1, wherein the current device comprises a pattern comparator for generating the test output signal based on the comparison of the incoming pattern to the internal pattern and a pattern generator for generating a test pattern, wherein the current device is further configured to output the test pattern at data output pins to the succeeding device, and wherein the test pattern is used in the test mode as the incoming pattern of the succeeding device.

3. The apparatus of claim 2, wherein the internal pattern carries hard-wired expected data, and wherein the pattern comparator comprises delay flip-flop (DFF) blocks for storing the hard-wired expected data.

4. The apparatus of claim 2, wherein the test pattern is used by the pattern comparator as the internal pattern to be compared with the incoming pattern.

5. The apparatus of claim 2, wherein the test pattern and the internal pattern are both '000'h, '1FF'h, '0AA'h, and '155'h.

6. The apparatus of claim 2, wherein the plurality of devices in series comprise a first device and a last device, wherein the controller is the preceding device of the first device as well as the succeeding device of the last device, and wherein the current device is any device located between the first and last devices.

7. The apparatus of claim 6, wherein the test pattern is: generated by each of the plurality of devices and by the controller; and passed, by each of the plurality of device and by the controller, to the respective succeeding device as the incoming pattern of the respective succeeding device.

8. The apparatus of claim 2, wherein the pattern comparator in the current device comprises an internal N-type metal-oxide-semiconductor (NMOS) logic, wherein the NMOS logic renders the test output signal to be high, indicating a pass, when the incoming pattern and the internal pattern match, and wherein the NMOS logic renders the test output signal to be low, indicating a failure, when the incoming pattern and the internal pattern mismatch.

9. The apparatus of claim 2, wherein the current device is configured to receive a system clock signal at test clock pins, and wherein the system clock signal controls timing of the generation of the test pattern and controls timing of the comparison between the incoming pattern and the internal pattern.

10. The apparatus of claim 1, wherein the controller is coupled to a plurality of channels, at least one of which is formed by connections between the controller and the plurality of devices, wherein the test channel output signal is generated as a logic AND operation of test results in the plurality of channels, and wherein a test failure of any of the channels leads to the failure of the test channel output signal.

11. The apparatus of claim 1, wherein each of the plurality of devices is a NAND flash memory chip located in a solid-state drive (SSD), wherein the controller is a memory controller in the SSD, and wherein the apparatus further comprises a printed circuit board (PCB) with electrical traces forming connections among the memory devices and the memory controller.

12. A method for performing surface mount testing (SMT) on a plurality of serially-connected memory devices that are coupled to a memory controller, the plurality of serially-connected memory devices including a current device connected between a preceding device and a succeeding device, the method comprising:

providing a test enable signal to each memory device to enable a test mode;

generating a plurality of test output signals in the test mode, each test output signal being generated from one memory device;

comparing, in the current device, an incoming pattern from the preceding device to an internal pattern in the current device, wherein the test output signal generated by the current device includes a failure status upon detecting a mismatch between the incoming pattern and the internal pattern, and wherein the failure status in the test output signal indicates a potential defect location to be in connections between the preceding device and the current device; and generating a test channel output signal in the memory controller, wherein a failure status in the test channel output signal indicates a potential defect location to be in connections between a device preceding the memory controller and the memory controller.

13. The method of claim 12, further comprising: generating a test pattern in the current device; and outputting the test pattern at data output pins to the succeeding device, wherein the test pattern is used in the test mode as the incoming pattern of the succeeding device.

14. The method of claim 13, wherein the test pattern and the internal pattern are both '000'h, '1FF'h, '0AA'h, and '155'h.

15. The method of claim 13, further comprising feeding a system clock signal into the current device, wherein the system clock signal controls timing of the generation of the test pattern and controls timing of the comparison between the incoming pattern and the internal pattern.

16. The method of claim 12, wherein the memory controller is coupled to a plurality of channels, one of which is formed by connections between the memory controller and the plurality of memory devices, wherein the test channel output signal is generated as a logic AND operation of test results in the plurality of channels, and wherein a test failure of any of the plurality of channels leads to the failure of the test channel output signal.

17. A memory system comprising:

a printed circuit board (PCB) comprising electrical traces forming connections among a plurality of serially-connected memory devices;

the plurality of memory devices mounted on a surface of the PCB, wherein the plurality of serially-connected memory devices include a current memory device connected between a preceding memory device and a succeeding memory device, and the current each memory device is configured to:

receive an incoming pattern from the preceding device at data input pins;

compare the incoming pattern to an internal pattern in the current device; and generate a failure status in a test output signal upon detecting a mismatch between the incoming pattern and the internal pattern, wherein the failure status in the last output signal indicates a potential defect location to be in connections between the preceeding memory device and associated with the current memory device.

18. The memory system of claim 17, further comprising a memory controller, mounted on the surface of the PCB and coupled to the plurality of serially-connected memory devices, wherein the plurality of serially-connected memory devices comprise a first memory device coupled to output pins of the memory controller and a last memory device coupled to input pins of the memory controller, wherein the memory controller is configured to supply the incoming pattern to the first memory device;

receive a test pattern from the last memory device; and generate a test channel output signal based on a comparison between the test pattern and an internal pattern stored in the memory controller, wherein a failure status in the test channel output signal indicates the existence of one or more potential defects in connections between the last memory device and the memory controller.

\* \* \* \* \*

UNITED STATES PATENT AND TRADEMARK OFFICE
CERTIFICATE OF CORRECTION

PATENT NO. : 9,476,938 B2
APPLICATION NO. : 14/478824
DATED : October 25, 2016
INVENTOR(S) : Hong Beom Pyeon et al.

Page 1 of 1

It is certified that error appears in the above-identified patent and that said Letters Patent is hereby corrected as shown below:

In the Claims

Column 14, Line 60, Claim 17 delete "each";

Column 15, Line 2, Claim 17 delete "last" and insert therefor --test--;

Column 15, Line 4, Claim 17 delete "associated with".

Signed and Sealed this
Fifth Day of June, 2018

Andrei Iancu
*Director of the United States Patent and Trademark Office*